(12) United States Patent  
Refai-Ahmed

(10) Patent No.: US 7,964,951 B2
(45) Date of Patent: Jun. 21, 2011

(54) MULTI-DIE SEMICONDUCTOR PACKAGE WITH HEAT SPREADER

(75) Inventor: Gamal Refai-Ahmed, Markham (CA)

(73) Assignee: ATI Technologies ULC, Markham, Ontario (CA)

( * ) Notice: Subject to any disclaimer, the term of this patent is extended or adjusted under 35 U.S.C. 154(b) by 220 days.

(21) Appl. No.: 12/404,819

(22) Filed: Mar. 16, 2009

(65) Prior Publication Data

US 2010/0230805 A1 Sep. 16, 2010

(51) Int. Cl.
*H01L 23/22* (2006.01)
(52) U.S. Cl. ......... 257/686; 257/706; 257/707; 257/777
(58) Field of Classification Search .................. 257/686, 257/706, 707, 717, 722, 777
See application file for complete search history.

(56) References Cited

U.S. PATENT DOCUMENTS

| | | | |
|---|---|---|---|
| 4,765,400 A * | 8/1988 | Chu et al. ....................... | 165/185 |
| 5,703,399 A | 12/1997 | Majumdar et al. | |
| 5,889,323 A * | 3/1999 | Tachibana .................... | 257/704 |
| 7,196,403 B2 * | 3/2007 | Karim .......................... | 257/675 |
| 7,361,986 B2 | 4/2008 | Yuan et al. | |
| 2006/0209516 A1 * | 9/2006 | Chengalva et al. .......... | 361/719 |
| 2007/0108595 A1 | 5/2007 | Refai-Ahmed | |
| 2010/0044856 A1 * | 2/2010 | Sri-Jayantha et al. ........ | 257/717 |

OTHER PUBLICATIONS

International Search Report and Written Opinion from Canadian Patent Office; International Application No. PCT/CA2010/000378; dated Jun. 23, 2010.

* cited by examiner

*Primary Examiner* — Phat X Cao
(74) *Attorney, Agent, or Firm* — Vedder Price P.C.

(57) ABSTRACT

A semiconductor device includes first and second stacked semiconductor dies on a substrate. A lid having a plurality of fins extending downwardly into the cavity is mounted on the substrate to encapsulate the semiconductor dies. At least some of the fins are longer than other ones of said fins. The lid is attached to the substrate, with the longer fins extending downwardly above a region of the substrate not occupied by the first die. The shorter fins extend downwardly above a region of said first die not covered by said second die. A thermal interface material fills the remainder of the cavity and is in thermal communication with both dies, the substrate and the fins. The lid may be molded from metal. The lid may be bonded to the topmost die, using a thermal bonding material that may be liquid metal, or the like.

19 Claims, 8 Drawing Sheets

MULTI-DIE SEMICONDUCTOR PACKAGE WITH HEAT SPREADER

FIELD OF THE INVENTION

The present invention relates generally to semiconductor devices and more particularly to semiconductor packages for stacked semiconductor dies.

BACKGROUND OF THE INVENTION

Current semiconductor devices typically include a die, a substrate, one or more metallization layers, I/O pins or balls, a heat spreader and optionally a heat sink. The die contains the active circuitry of the device. The die is typically mounted on the substrate or in a cavity within the substrate. One or more of the metallization layers include pads called bond-fingers that are used to interconnect the metallization layers to die-pads of the die. The die pads are, in turn, interconnected with the active circuitry of the die. The metallization layers route electrical connections within the substrate from the die to the I/O pins or balls.

The die-pads may be electrically coupled to the bond-fingers using conventional wire bonding, by connecting the pads to the bond-fingers by conductive wires. Alternatively, the die can be mounted with its active surface, facing the substrate. Die pads extend from the active surface, and may connect to the bond-fingers using electrically conductive bumps extending from the die. As the active surface faces down, such semiconductor devices are often referred to as "flip chip" packages.

In modern semiconductor packages, the continued push for higher performance and smaller size leads to higher operating frequencies and increased package density (more transistors). However, in operation the circuitry on such a die consumes an appreciable amount of electrical energy. This energy invariably creates heat that must be removed from the package. Conventional heat spreaders and heat sinks may be used to dissipate the heat generated by the die. However, as the majority of the heat is generated in the die, the relative distribution of thermal energy within the chip package is often quite uneven.

More recently, in an effort to include more transistors in a single package, multiple dies may be packaged in a single semiconductor device. For example, dies may be stacked one upon another with each die interconnected with the substrate. To this end, U.S. Pat. No. 7,361,986 discloses semiconductor device with two stacked dies, a first die mounted in a flip-chip configuration with another mounted atop the first die, and wire bonded to the substrate.

As the geometry of multiple dies become more complex, and the number of transistors increases, dissipating heat from the electronic dies becomes an increasing problem.

Accordingly, there is a need for a semiconductor package that assists in the heat dissipation of multiple dies.

SUMMARY OF THE INVENTION

Exemplary of an embodiment of the present invention, a semiconductor device includes first and second stacked semiconductor dies on a substrate. A lid having a plurality of fins extending downwardly into the cavity is mounted on the substrate to encapsulate the semiconductor dies. At least some of the fins are longer than other ones of said fins. The lid is attached to the substrate, with the longer fins extending downwardly above a region of the substrate not occupied by the first die. The shorter fins extend downwardly above a region of said first die not covered by said second die. A thermal interface material fills the remainder of the cavity and is in thermal communication with both dies, the substrate and the fins. The lid may be molded from metal. The lid may be bonded to the topmost die, using a thermal bonding material that may be liquid metal, or the like.

In accordance with an aspect of the present invention, there is provided a semiconductor device comprising: a substrate; first and second dies, each having an integrated circuit formed thereon; the first die supported by the substrate; the second die mounted atop the first die; a lid defining a cavity, the lid comprising a plurality of fins extending downwardly into the cavity, at least some of the fins being longer than other ones of the fins, the lid attached to the substrate, with the longer fins extending downwardly above a region of the substrate not occupied by the first die; the shorter fins extending downwardly above a region of the first die not covered by the second die; a thermal interface material filling the remainder of the cavity and in thermal communication with the first and second dies; the substrate and the fins.

In accordance with another aspect of the present invention, there is provided a semiconductor device comprises a substrate; a die, having an integrated circuit formed thereon, and mounted on the substrate; a lid defining a cavity, the lid comprising a plurality of fins extending downwardly into the cavity; metal deposits formed atop of the die; a thermally insulated material filling the remainder of the cavity and in thermal communication with the die; the metal deposits; the substrate and the fins.

In accordance with an aspect of the present invention, there is provided a method of forming a semiconductor device, comprising: forming a lid defining a cavity, and a plurality of fins extending into the cavity; mounting first and second semiconductor dies, in a stacked arrangement on a substrate; filling the cavity of the lid with a thermal interface material; mounting the lid, with the thermal interface material on the substrate to encapsulate the first and second semiconductor dies, with the thermal interface material in contact with the fins, the dies, and the substrate.

Other aspects and features of the present invention will become apparent to those of ordinary skill in the art upon review of the following description of specific embodiments of the invention in conjunction with the accompanying figures.

BRIEF DESCRIPTION OF THE DRAWINGS

In the figures which illustrate by way of example only, embodiments of the present invention.

DETAILED DESCRIPTION

Figure 1:
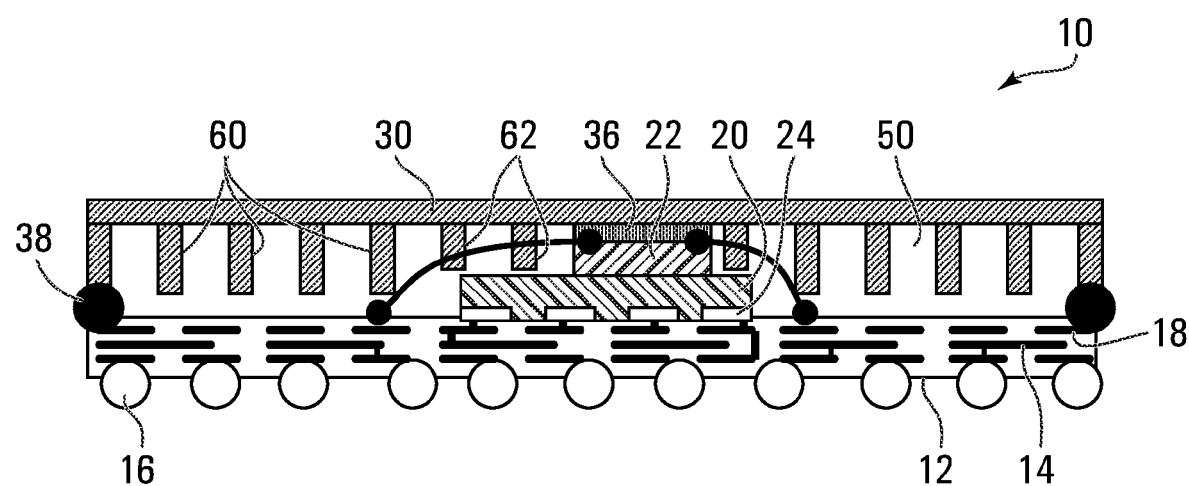
FIG. 1 is a cross-sectional view of a semi-conductor device, exemplary of an embodiment of the present invention.

FIG. 1 shows a semiconductor device 10, exemplary of an embodiment of the present invention, in cross-section. As illustrated, semiconductor device 10 includes a substrate 12, several dies 20, 22, package pins 16 and a lid 30. As will become apparent, lid 30 acts as a heat spreader.

Formed within substrate 12 are multiple metallization layers 14 formed proximate the bottom surface of substrate 12. Metallization layers 14 may be connected to each other with microvias 18, and electrically interconnect dies 20, 22 to package pins 16.

Exemplary substrate 12 is single sided: metallization layers 14 are formed only proximate one side of substrate 12. Conveniently, in a single sided substrate, plated through holes which may span the entire height of the substrate between metallization layers on opposite sides of the substrate are avoided. Of course, substrate 12 could be replaced with a dual sided substrate.

Package pins 16, may be pins, solder balls arranged in ball grid array, or any other know electrical package interconnect.

Die 20 is supported by substrate 12. In the depicted embodiment, die 20 rests atop the top surface of substrate 12, or may be embedded in substrate 12, as for example, detailed in U.S. Patent publication 2007/0108595, the contents of which are hereby incorporated by reference. Die 20 is attached with its active surface facing down and die pads 24 connecting die 20 to metallization layer 14. A standard microvia formation is used to couple under bump metallization (UBM) of die 20 to metallization layer 14 of substrate 12. Underfill (not shown) may further affix die 20 to substrate 12.

Die 22 is mounted atop die 20. Die 22 may be attached to substrate 12 by wire bonding extending from contact points of die 22 around the periphery of die 22. Alternatively, dies 20 and 22 may be electronically interconnected directly to each other by way of silicon microvias formed in dies 20, 22.

Die 20 may, for example, embody a general purpose processor, graphics processor, or the like having one or more processing cores. Die 22 may be processor readable memory, in the form of static or dynamic memory (DRAM, SDRAM or the like), readable by the processor embodied in die 20. Of course, dies 20, 22 could embody other electronic devices, such as application specific integrated circuits, microcontroller, field programmable gate arrays, or the like. Electrical interconnection between die 20 and 22 may be accomplished through substrate 12.

Viewed from above then, a region of the surface of substrate 12 is covered by die 20, and another region (the remainder of the surface of substrate 12) is not. Also, a region of die 20 is covered by die 22. Topographically, substrate 12 with dies 20, 22 thereon thus has regions of three different heights or elevations.

Figure 2:
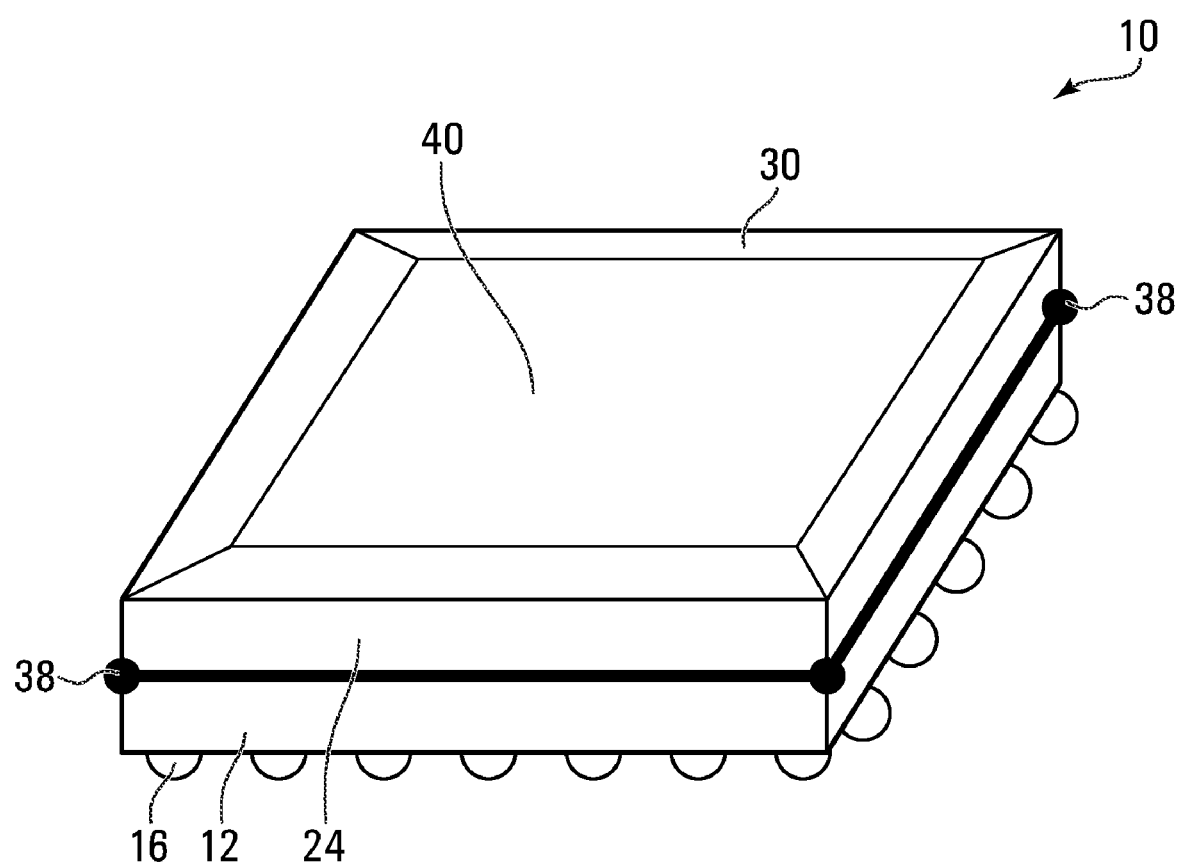
FIG. 2 is a perspective view of the semi-conductor device of FIG. 1.

Lid 30 acts as cap for device 10, and as a heat spreader. Lid 30 is attached to substrate 12 by glue around its edges as more particularly illustrated in FIG. 2. Specifically, a glue seam 38, formed of epoxy or the like, connects the edge of lid 30 to substrate 12. The region between lid 30 and substrate 12 is filled with thermal interface material (TIM) 50. In the depicted embodiment, TIM 50 is a viscous, semi-viscous, liquid or similar thermal interface material. Suitable materials for TIM 50 may be inorganic gels; organic gels; grease; or the like. Suitable gels may be available from Shin-Etsu Chemicals of Tokyo Japan, under for example, part number Shin-Etsu MicroSI x23-7809. Suitable greases, such as G751 thermal grease, will be known to those or ordinary skill, although many currently available greases may spread away (or be "pumped") from areas of local heat.

The distance from the top of lid 30, and substrate 12 with dies 20, 22 will vary in dependence on the elevation of the combination of dies 20, 22 and substrate 12. For a lid having a generally flat top surface, regions corresponding to overlapping dies 20, 22 will be closest to lid 30. Regions corresponding to die 20, without the overlap of die 22 will be farther from lid 30. Regions corresponding to substrate 12 on which no die 20/22 is mounted will be farthest from lid 30.

Figure 3:
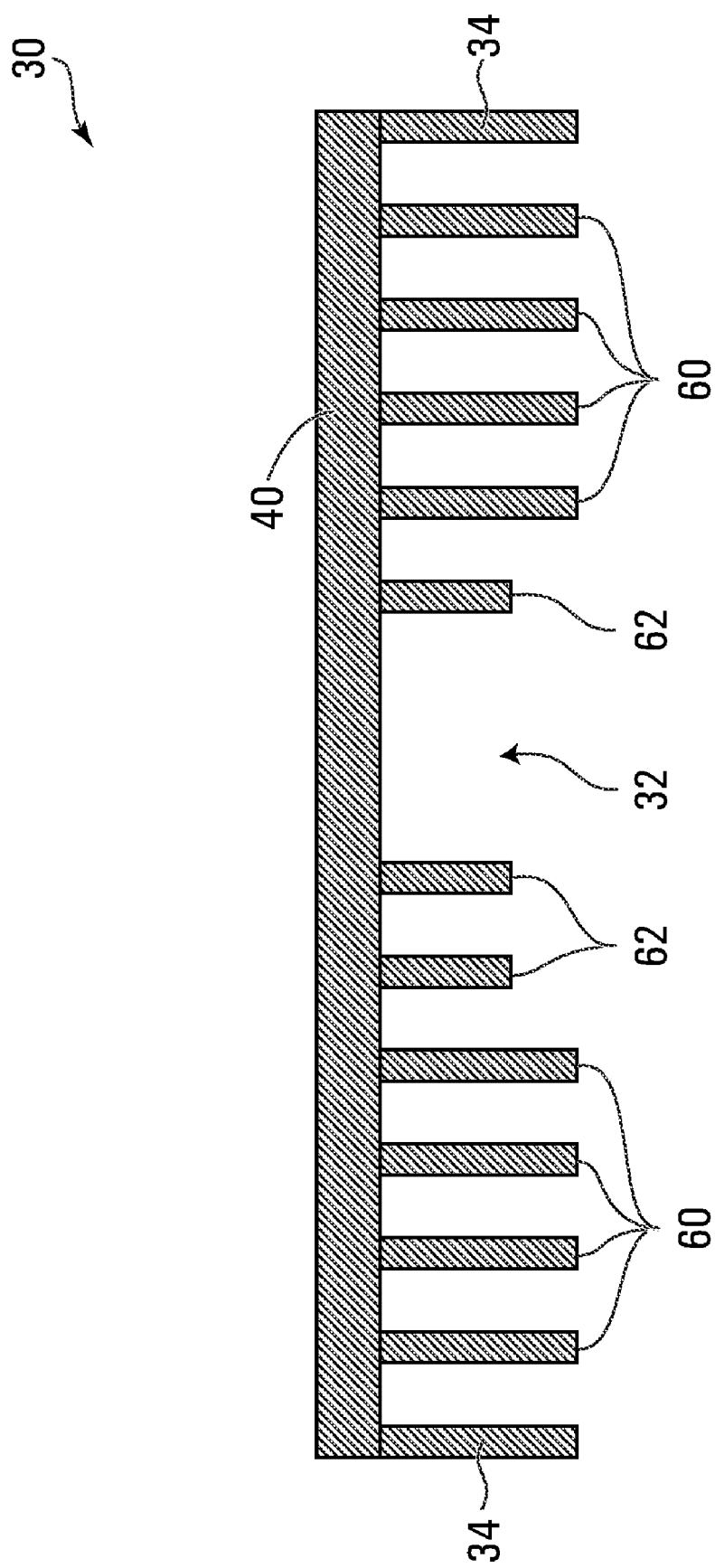
FIG. 3 is a cross-sectional view of a heat spreader of the semi-conductor device of FIG. 1.
Figure 4:
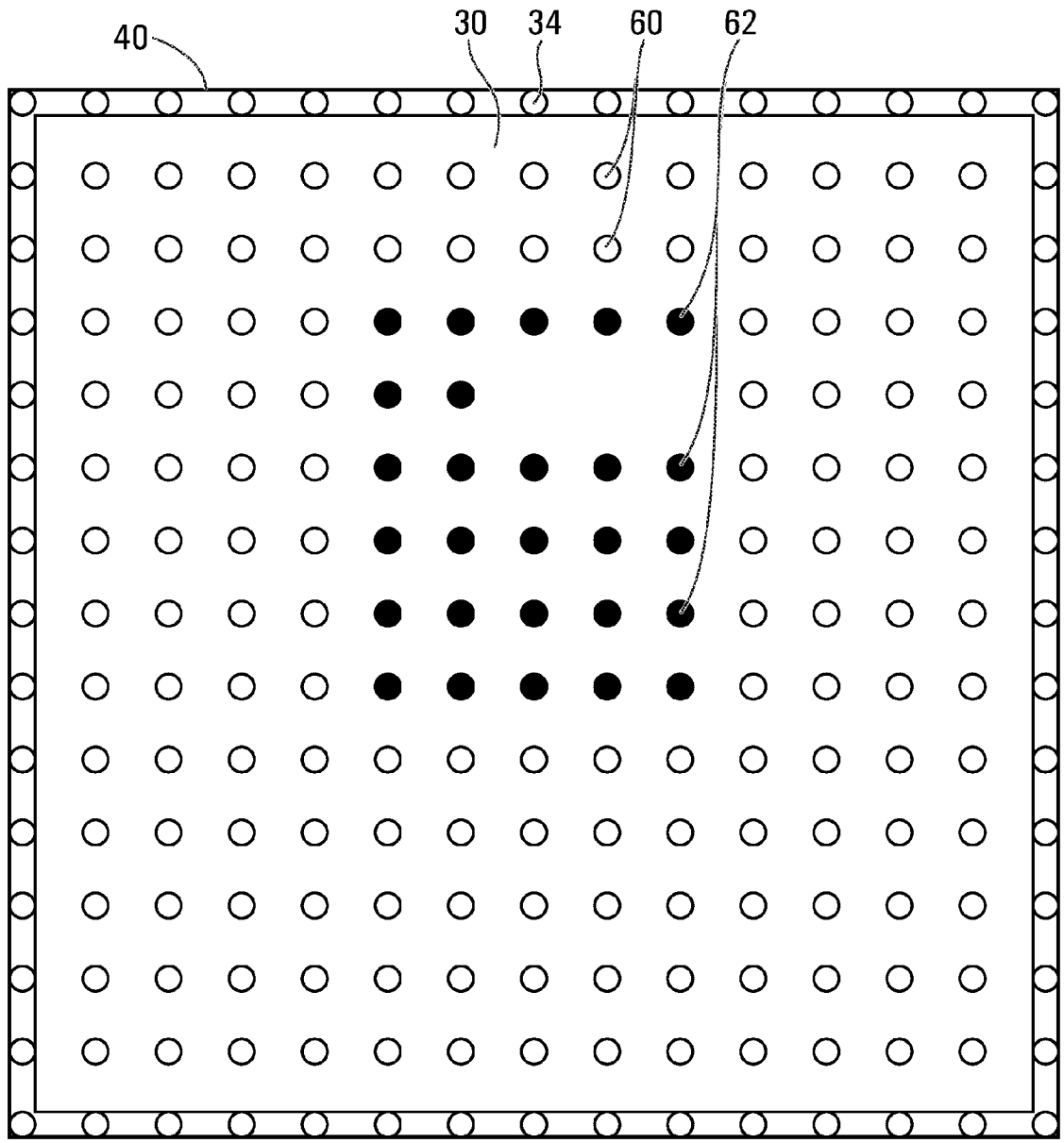
FIG. 4 is a plan view from below of the heat spreader of FIG. 3.

A more detailed view of lid 30 is depicted in FIGS. 3 and 4. As illustrated, lid 30 is generally dome shaped having a flat top 40, and a downward extending outer peripheral wall 34. Top 40 and outer peripheral wall 34 extending downwardly from top 40, define a cavity 32. As should be apparent, cavity 32 defined by lid 30 covers substrate 12 and receives dies 20, 22.

Lid 30 further includes a plurality of fins 60 and 62, extending downwardly from the flat top 40 of lid 30. Fins 60 and 62 extend downwardly into cavity 32. In the example lid 30, each of fins 60 and 62 are generally cylindrical having a uniform circular horizontal cross section. Typically, fins 60, 62 will have a cross-sectional area of 1 μm² or greater. An optimal cross-sectional area may be experimentally determined. A person of ordinary skill will however, recognize that the cross sections of fins 60, 62 need not be uniform or circular. They could be oval, square, or rectangular in cross section, uniform, conical, or any other suitable shape.

Similarly, top 40 need not be flat, and could have another suitable shape.

As further illustrated in FIGS. 3 and 4, fins 60 have different length than fins 62. Shorter fins 62 extend proximate the region of lid 30 that aligns with die 20 (and not die 22), when lid 30 is attached to substrate 12, while no fins are located in the region that aligns with die 22. Finally, longer fins 60 align or extend downward in areas not occupied either by die 22 or 20.

Typically, shorter fins extend a length form surface 40 of lid 30, so that they do not extend beyond the entire thickness of die 22. Longer fins 60 extend substantially to substrate 12, and therefore have a length that approximates the combined thickness of die 22 and die 20.

Lid 30 may be formed of a molded heat conducting material, such as a metal including for example aluminium, steel or the like. Lid 30 (including fins 60/62) may be integrally formed by, for example, by stamping, moulding or using other conventional fabrication techniques. Lid 30 could alternatively be formed from another heat conducting material, such as a suitable ceramic, alloy, or the like.

TIM 50 fills the remainder of cavity 32, and conveniently thermally connects dies 20 and 22 with fins 60 and 62 of lid 30. Further, TIM 50 thermally couples lid 30 to substrate 12 while increasing the overall thermal capacity of device 10. Conveniently, TIM 50 fills the geometrical nooks created by the geometric arrangement of stack dies 20 and 22.

Further, lid 30 may be directly attached to die 22. For example, as illustrated in FIG. 1, die 22 may be bonded to lid 30, using for example a heat conductive bonding material 36. For example, die 22 may be bonded to lid 30 using a liquid metal, such as gallium, indium or a nano-foil, as for example available from Reactive Nanotechnologies Inc. To facilitate bonding, die 22 may have its top surface coated with a metal or solder, making bonding material 36 more adhesive to die 22.

Device 10 may be manufactured by first mounting dies 20, 22 on substrate 12, in a conventional manner. In so doing, dies 20, 22 may be electrically and mechanically bonded to substrate 12 and to each other as required. Bonding material 36 (and any coating on die 22) may be affixed to die 22. TIM 50 may fill cavity 32 of a pre-formed lid 30 (including fins 60, 62). A bead of epoxy 38, or the like, may be placed around the periphery of lid 30. Lid 30 may then be placed atop substrate 12. Epoxy 38 may cure, affixing lid 30 to substrate 12.

TIM 50 may be chosen to remain generally viscous after production, preventing it from drying. Alternatively TIM 50 may be chosen to partially or entirely cure once lid 30 is atop substrate 12.

In operation, power and electrical signals are applied to device 10, by way of package pins 16. Signals and power are provided to dies 20, 22 through metallization layer 14. Heat generated by dies 20, 22 is conducted to lid 30 by bonding material 36, TIM 50, and fins 60, 62. TIM 50 and fins 60, 62 act to distribute heat uniformly in device 10. Because TIM 50 is in contact with substrate 12, heat is similarly coupled to substrate 12.

Ultimately heat is transferred to the atmosphere by conduction or convection, as lid 30 and substrate 12 are in thermal communication with the environment. An external fan or other cooling device (not shown) may aid in transporting dissipated heat from device 10.

TIM 50 is conveniently sealed within cavity 32, and may remain in viscous form—i.e. gel or liquid, permanently, while device 10 is in operation.

Figure 5A:
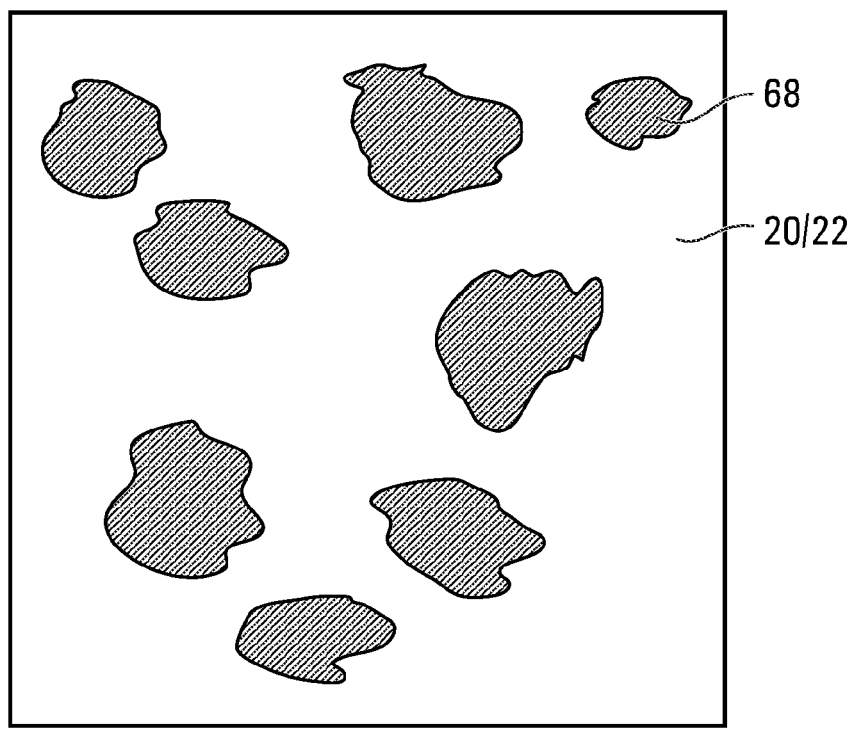
FIGS. 5A and 5B illustrate optional metal deposit on a die of the device of FIG. 1, exemplary of an embodiment of the present invention.
Figure 5B:
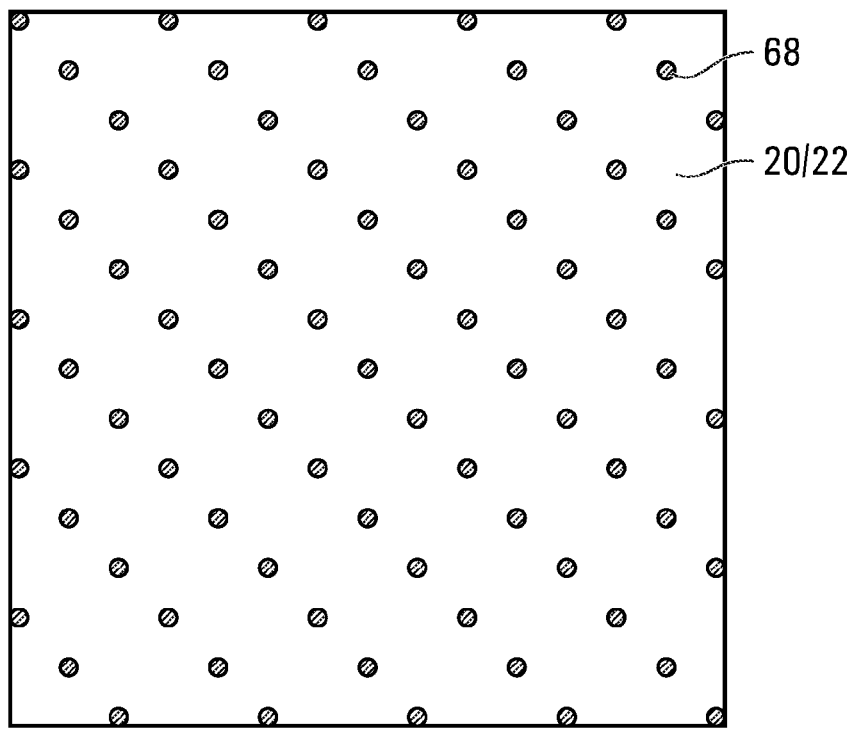

To further facilitate heat transfer from dies 20, 22, portions of the upward facing surface of dies 20, 22 may further be covered with metal deposits 68 as, for example depicted in FIG. 5A. Thus, the upward facing surface of die 20 not in contact die 22 could include metal deposit 68 as illustrated in FIGS. 5A or 5B. Likewise, die 22 could have its top surface covered with such deposits, in place of or in addition to any metal layer covering the top of die 22. As illustrated in FIG. 5A, metal deposit 68 may be arbitrary, thin dabs of metal in the form of solder extending from the top surface of die 20, that further aid in thermally coupling die 20 to TIM 50. Deposits so formed function as a heat sink affixed to die 20, to allow conduction of heat away from die 20 into TIM 50.

Deposit 68 may be formed by applying thin dabs of metal such as solder in random or determined positions on die 20. Solder may be conventional tin/lead solder or lead-free solder, silver, gold, or the like as known to those of ordinary skill. Deposits 68 may have a thickness in the sub-micron range (i.e. <1 μm). Conveniently, deposits 68 may also trap TIM 50. This may be particularly beneficial where TIM 50 is pumped away from local areas of greater heat.

As will be appreciated, deposit 68 could also be used on a single die semiconductor in a package such as that disclosed in US Patent Publication No. US 2007/0108595.

Optionally, deposit 68 may be interconnected with a wire or filament directly to lid 30 to further conduct heat away from dies 20, 22.

Figure 6:
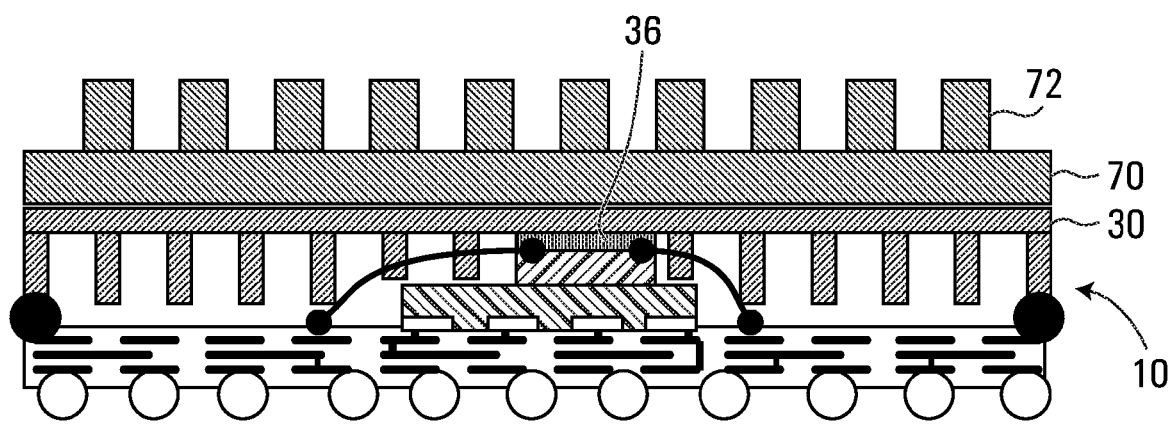
FIG. 6 is a cross-sectional view of a semi-conductor device, exemplary of another embodiment of the present invention.

In an alternate embodiment depicted in FIG. 6, a further heat sink 70 with upwardly extending fins may be attached to lid 30. Thermal interface materials such as thermal glue (not shown) may be used to attach heat sink 70 on top of lid 30. Heat sink 70 may have a base 74, attached to top surface 40 of lid 30. Upwardly extending fins 72, extend from base 74 and may transport heat from heat sink 70 and thus, lid 30 into the atmosphere. The shape and arrangement of fins 72 may be conventional and may, for example, be cylindrical, rectangular or any other arbitrary shape.

Figure 7:
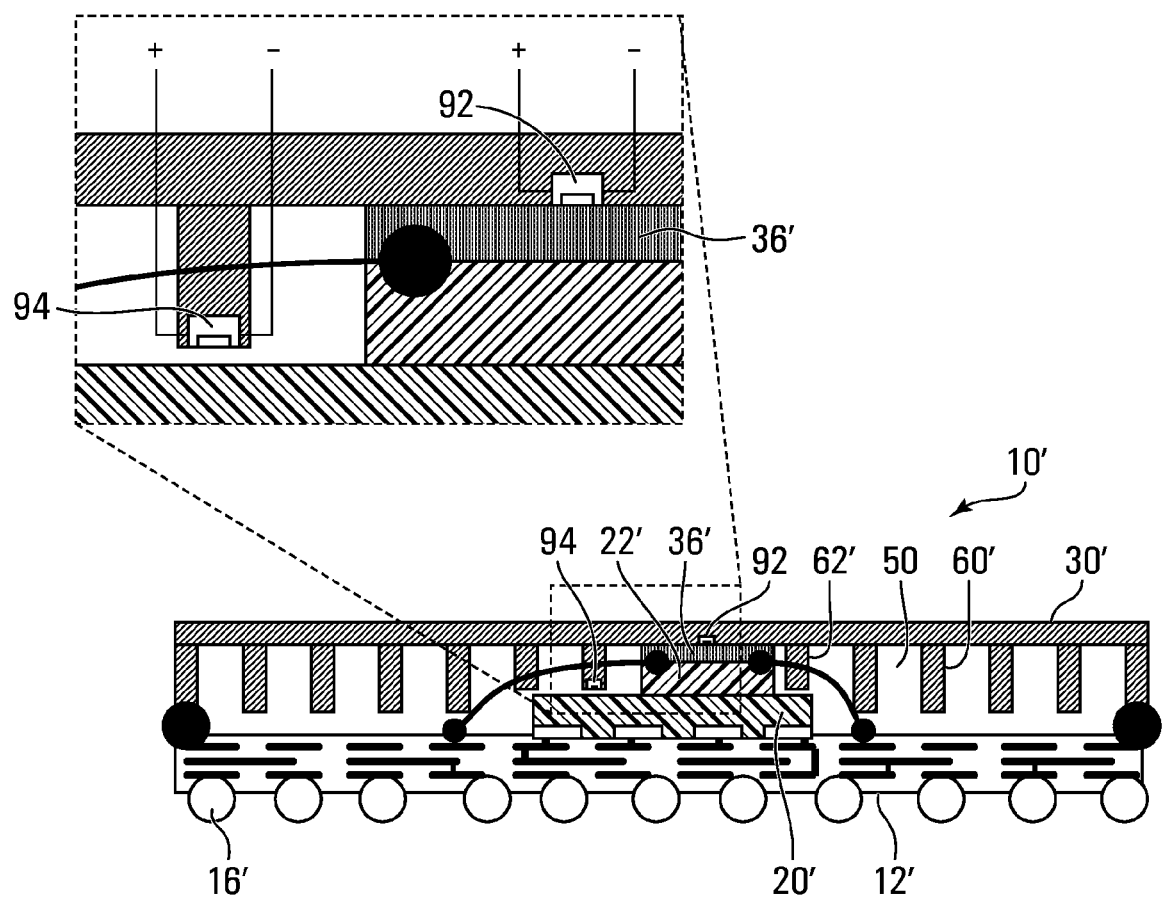
FIG. 7 is a cross-sectional view of a semi-conductor device, exemplary of another embodiment of the present invention.

In further alternate embodiments, fins 60/62 could be replaced with thermal electric coolers or vapour chambers. To this end, FIG. 7 illustrates a further embodiment of semiconductor 10' substantially identical to the embodiment of FIG. 1 (elements that are the same as those in the embodiment of FIG. 1 are denoted with a prime (') symbol and will not be further explained). However, lid 30' includes a plurality of thermal electric cooling fins 60'/62' including thermoelectric micro-coolers (μTec) 92/94 that may rely on the Pelletier effect. A typical thermoelectric module is manufactured using two thin ceramic wafers with a series of P and N doped bismuth-telluride semiconductor material between them. The ceramic material on both sides of the semiconductor provides rigidity and electrical insulation. The N type material has an excess of electrons, while the P type material has a deficit of electrons. As electrons move from P to N they transition to a higher energy state (absorbing heat energy), and as they move from N to P, attain a lower energy state (giving off heat energy) thereby providing cooling to one side. Thermoelectric micro-coolers (μTEC) are known and commercially available. As shown in FIG. 7, one or more μTECs 92, 94 can be embedded in surface 40' of lid 30', and in all, or selected fins 60', 62'. Fins 60' or 62' in which a μTECs 94 is embedded may be chosen as proximate localized regions of the dies 20', 22' where heat dissipation is high. A DC power source (not shown) to power μTECs 92, 94 can be supplied externally. Again, cavity 32' may be filled with a suitable TIM 50' to couple dies 20', 22' to fins 60', 62'.

Figure 8:
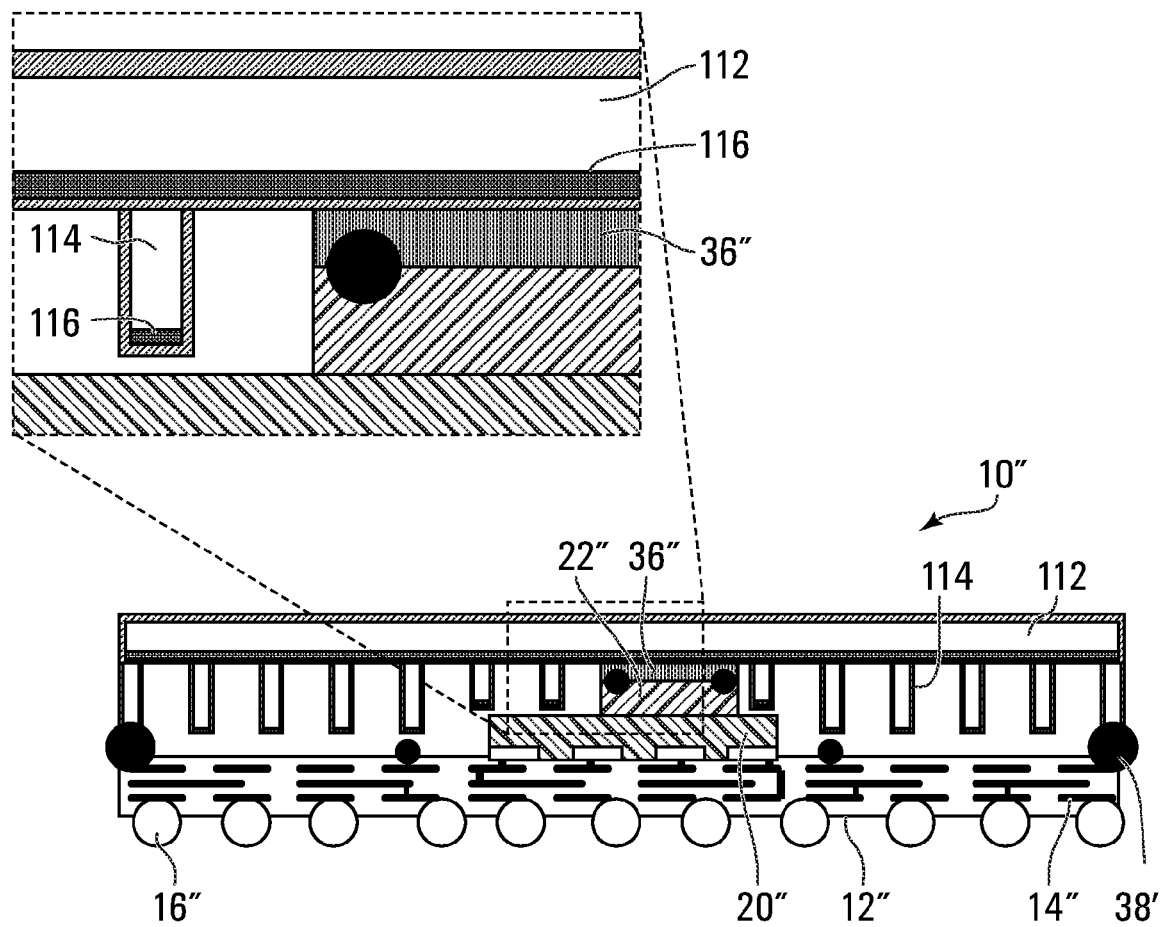
FIG. 8 is a cross-sectional view of a semi-conductor device, exemplary of another embodiment of the present invention.

Lid 30 can also optionally accommodate one or more vapour chambers. To this end, FIG. 8 illustrates a further embodiment of semiconductor 10" substantially identical to the embodiment of FIG. 1 (again elements that are the same as those in the embodiment of FIG. 1 are denoted with a prime (") symbol and will not be further explained). However, lid 30" includes a vapour chamber 112 and heat pipes 114. Liquid 116 such as water is introduced into a grooved rectangular volume (chamber) 112 within the top of lid 30" to form a vapor chamber 112. Vapor chamber 112 is a generally rectangular cavity within the top of lid 30". Heat generated by dies 20", 22" causes the water molecules evaporate. When the vapor condenses, heat is given off at the ceiling of chamber 112 thereby achieving the desired cooling; and the process repeats. Additionally, fins 60"/62" (like fins 60/62) could also be made hollow and water could be introduced, so as to form heat-pipes 114. Pipes 114 adjoin the vapor chamber 112 in the base of lid 30". Heat is transferred upward through pipes 114 to the adjoining vapor chamber 112.

Numerous variations of shapes and sizes of the base of the fins different constellations of fins 60/62 as well as different shapes of the generally flat area will become immediately apparent to one skilled in the art without departing from the scope of the claims attended herein.

As will now be appreciated, embodiments disclosed herein could easily be modified to include more than two dies. For example three, or more dies could be stacked. Lid 30 could be adapted accordingly, having fins of three or more different lengths. Likewise, substrate 12 could have formed thereon multiple stacked dies spaced from each other on substrate 12. Fins on lid 30 could accordingly be arranged above the regions not occupied by dies, and in the regions above the dies.

Conveniently, use of lid 30/30'/30" allows for tolerance in dies 20,22 (20'/22' or 20"/22"). Cavity 32 is filled by both fins 60/62, TIM 50 and bonding material 36. As such, variations in the thicknesses of dies 20, 22 can be accommodated by lid 30, while retaining heat transfer from dies 20, 22 to lid 30, and thus to the atmosphere.

Of course, the above described embodiments, are intended to be illustrative only and in no way limiting. The described embodiments of carrying out the invention, are susceptible to many modifications of form, arrangement of parts, details and order of operation. The invention, rather, is intended to encompass all such modification within its scope, as defined by the claims.

What is claimed is:

1. A semiconductor device comprising:
   a substrate;
   first and second dies, each having an integrated circuit formed thereon;
   said first die supported by said substrate;
   said second die mounted atop said first die;
   a lid defining a cavity, said lid comprising a plurality of fins extending downwardly into said cavity, at least some of said fins being longer than other ones of said fins, said lid attached to said substrate, with said longer fins extending downwardly above a region of said substrate not occupied by said first die; said shorter fins extending downwardly above a region of said first die not covered by said second die;
   a thermal interface material filling the remainder of said cavity and in thermal communication with said first and second dies; said substrate and said fins.

2. The semiconductor device of claim 1, further comprising a heat bonding material between said second die and said lid, thermally connecting said second die to said lid.

3. The semiconductor device of claim 2, wherein said heat bonding material comprises a liquid metal.

4. The semiconductor device of claim 3, where said liquid metal comprises one of gallium, indium.

5. The semiconductor device of claim 1, further comprising metal deposits on a top surface of at least one of said first and second dies.

6. The semiconductor device of claim 5, wherein said metal deposits comprise gold, silver, tin.

7. The semiconductor device of claim 1, further comprising nano-foil on a top surface of at least one of said first and second dies.

8. The semiconductor device of claim 5, wherein said metal deposits have a thickness of about 1 μm.

9. The semiconductor device of claim 1, wherein said substrate further comprises a metallization layer, and wherein said second die is wire bonded to said metallization layer.

10. The semiconductor device of claim 2, wherein said first die is flip-chip mounted on said substrate.

11. The semiconductor device of claim 10, wherein said first and second dies are electrically interconnected to each other through said metallization layer.

12. The semiconductor device of claim 10, wherein said first and second dies are electrically interconnected to each other through said silicon microvias.

13. The semiconductor device of claim 1, wherein said fins have a generally uniform cross-section.

14. The semiconductor device of claim 1, wherein said thermal interface material comprises at least one of thermal grease and a thermal gel.

15. The semiconductor device of claim 1, further comprising a plurality of upwardly extending fins, extending from said lid.

16. The semiconductor device of claim 1, further comprising at least one thermoelectric cooler formed in said lid.

17. The semiconductor device of claim 16, wherein said at least one thermoelectric cooler formed is in one of said plurality of fins.

18. The semiconductor device of claim 1, further comprising a liquid filled vapour chamber formed in said lid.

19. The semiconductor device of claim 18, wherein at least some of said fins define a hollow heat pipe, in communication with said liquid filled vapour chamber.

* * * * *